(12) United States Patent
Kukita et al.

(10) Patent No.: US 6,733,320 B2
(45) Date of Patent: May 11, 2004

(54) CONTACT FOR PGA AND PGA SOCKET

(75) Inventors: Hiroaki Kukita, Yokohama (JP); Yoshifumi Nishida, Yokohama (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/102,432

(22) Filed: Mar. 20, 2002

(65) Prior Publication Data
US 2002/0151204 A1 Oct. 17, 2002

(30) Foreign Application Priority Data
Apr. 13, 2001 (JP) ....................... 2001-114887

(51) Int. Cl.[7] ............................................. H01R 13/625
(52) U.S. Cl. ....................................................... 439/342
(58) Field of Search ................................ 439/342, 259, 439/857, 856

(56) References Cited

U.S. PATENT DOCUMENTS 6,113,411 A * 9/2000 Lu et al. ..................... 439/342
6,319,038 B1 * 11/2001 Howell et al. ............... 439/342
6,375,485 B1 * 4/2002 Lin ............................. 439/342
6,443,752 B1 * 9/2002 Kosawa ....................... 439/342
6,450,826 B1 * 9/2002 Howell et al. ............... 439/342

FOREIGN PATENT DOCUMENTS

JP  9-17492  1/1997

* cited by examiner

*Primary Examiner*—Gary Paumen
(74) *Attorney, Agent, or Firm*—Rosenthal & Osha L.L.P.

(57) ABSTRACT

A contact 4 for a PGA socket 1 is formed with a plate-like base portion 41, a pair of projecting portions 42a, 42b provided continuously at one end of the base portion 41 to extend in a direction substantially equal to the base portion, a turned portion 43 provided continuously at the other end of the base portion 41 to face the base portion 41, and a tail portion 44 provided continuously at the other end of the base portion 41 not to face the base portion 41. The turned portion 43 is provided with a contact portion 43a contacting a pin of a PGA package on a surface of the turned portion 43 not facing the base portion 41. This prevents flux from adhering on the contact portion 43a of the contact 4 when the contact 4 is soldered on a board.

4 Claims, 9 Drawing Sheets

CONTACT FOR PGA AND PGA SOCKET

BACKGROUND OF THE INVENTION

The present invention relates to a contact for PGA and a PGA socket for connecting a PGA (Pin Grid Array) package provided with a plurality of pins in a grid array fashion to a circuit board substrate and the like.

A PGA socket includes a base housing formed with contact holes in a grid array fashion, a plurality of contacts located in the contact holes, a cover housing formed with through holes in a grid array fashion which the pins of the PGA package can be inserted through, and a sliding mechanism for sliding the cover housing over the base housing. Each contact includes a press-fitting portion for press-fitting the contact to be engaged to the base housing, a contact portion for being in contact with a pin of the PGA package, and a soldering portion for soldering the contact to a printed circuit board and the like. By soldering a plurality of contacts on a printed circuit board and the like, the PGA socket is mounted thereon.

The pins of the PGA package are inserted into the PGA socket through the trough holes of the cover housing by zero insertion force to a position in which the pins of the PGA package face the contact portions of the contacts. The cover housing is slid over the base housing by the sliding mechanism of the PGA socket and then the pins of the PGA package come in contact with the contact portions of the contacts to be electrically connected therewith. Signals can be thereby transmitted between the PGA package and the printed circuit board and the like.

However, upon soldering the soldering portions of the contacts on the printed circuit board and the like, flux may go into the PGA socket from the soldering portions through the gap between the contacts and the base housing to adhere on the contact portions of the contacts. In such a case, even if the pins of the PGA package and the contacts are contacted, a loose electrical connection is arisen that the pins and the contacts are not electrically connected. For this reason, yield of products containing PGA sockets, printed circuit boards, etc. has been decreased.

It is an object of the present invention to provide a construction of a contact for PGA that prevents a loose electrical connection caused by flux adhering on a contact portion of the contact and increases the yield of the products and to provide a PGA socket including contacts of the construction.

BRIEF SUMMARY OF INVENTION

A contact for PGA of the present invention formed by bending a metal plate comprises a plate-like base portion, a projecting portion provided continuously in the base portion to extend in a direction substantially equal to the base portion, a turned portion provided continuously at one end of the base portion to face the base portion, and a tail portion provided continuously at the other end of the base portion not to face the base portion.

According to the contact for PGA, where the turned portion is used as a contact portion of the contact and a surface of the turned portion not facing the base portion is used as a contact surface for being in contact with a pin of a PGA package, even when the tail portion is soldered on a board and the like, a frequency of adhesion of flux is lowered to a great extent since flux may usually move between the base portion and a surface of the turned portion facing the base portion. For this reason, when the above-mentioned contact is used for a PGA socket, a loose electrical connection of the pins and the contacts can be prevented, resulting in increase in yield of the products. The contact for PGA may be manufactured at low cost since the contact may be obtained by bending the metal plate.

PGA sockets include PGA sockets used in desktop personal computers, micro PGA sockets used in notebook type personal computers and the like.

The above-mentioned contact for PGA further includes a pair of facing portions provided continuously in the turned portion to extend in a direction substantially perpendicular to a direction connecting between the one end of the base portion and the other end of the base portion add to face each other. According to the contact for PGA, when a pair of facing portions is used as contact portions, a pin of a PGA package and the contact are electrically connected more reliably, since the contact and the pin are to be in contact at two points.

A PGA socket of the present invention comprises the above-mentioned contacts for PGA, a base housing formed with a large number of contact holes for holding the contacts by a press-fit of the projecting portion in a grid array fashion, a cover housing located to overlap the base housing and formed with a large number of through holes in a grid array fashion through which the pins of the PGA package for being electrically connected with the contacts for PGA can be inserted, and a sliding mechanism for sliding the cover housing over the base housing.

According to the PGA socket, each contact used therein has a construction where flux is difficult to adhere on the contact portion for being in contact with the pin of a PGA package. Therefore, a loose electrical connection caused by flux adhering on the contact portion is not likely to occur, resulting in increase in yield of the products.

BRIEF DESCRIPTION OF DRAWINGS

FIG. 4(a) is a front view of the contact shown in FIG. 3;

FIG. 4(b) is a left side elevation view of the contact;

FIG. 4(c) is a right side elevation view of the contact;

FIG. 4(d) is a top plan view of the contact;

FIG. 5(a) shows pins of a PGA package being inserted;

FIG. 5(b) shows the contacts and the pins being in contact;

DETAILED DESCRIPTION OF THE PREFERRED EMBODIMENTS

Embodiments of the present invention will be described below with reference to the drawings.

A First Embodiment

Figure 1:
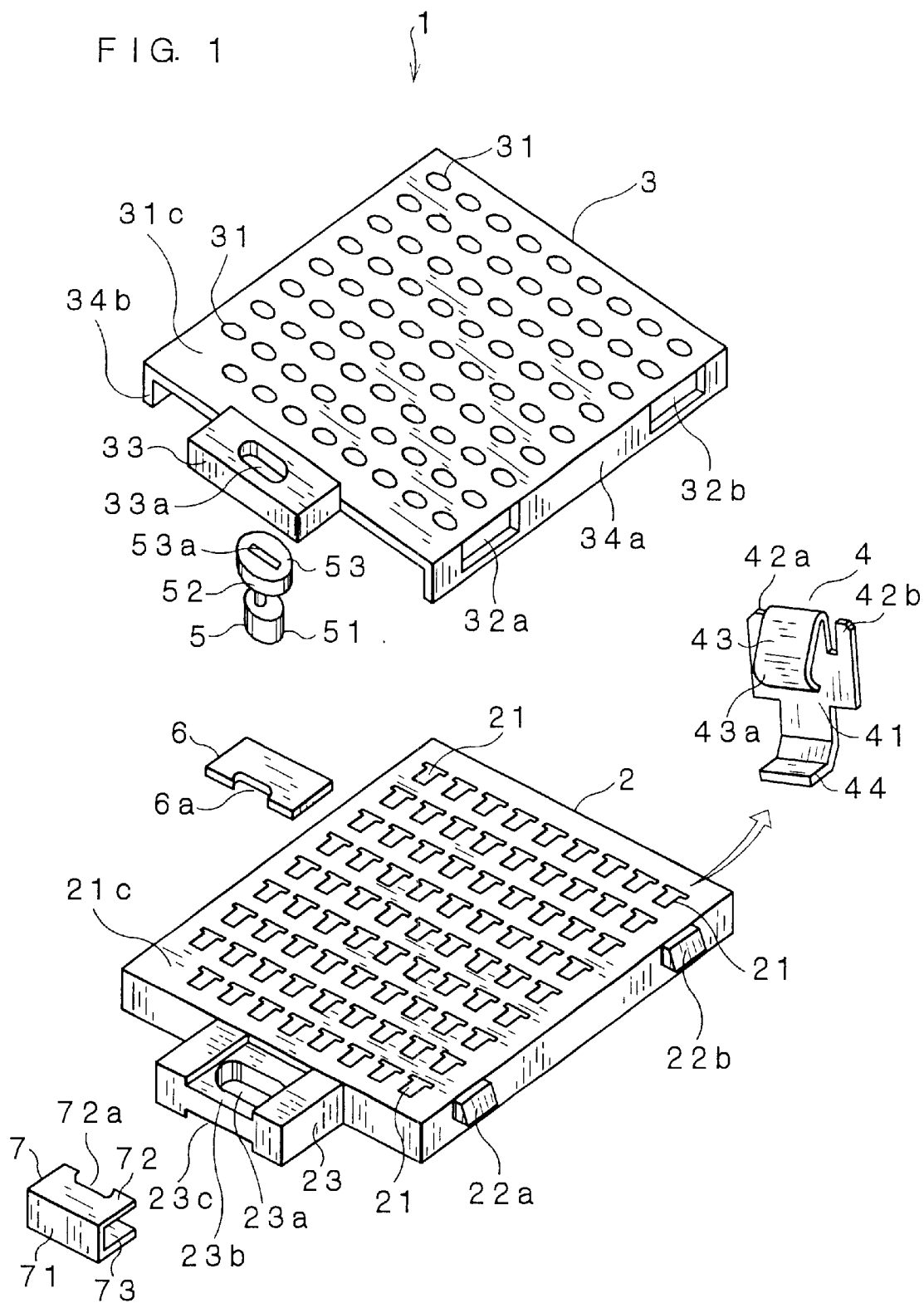
FIG. 1 shows an exploded perspective view of a PGA socket according to a first embodiment.
Figure 2:
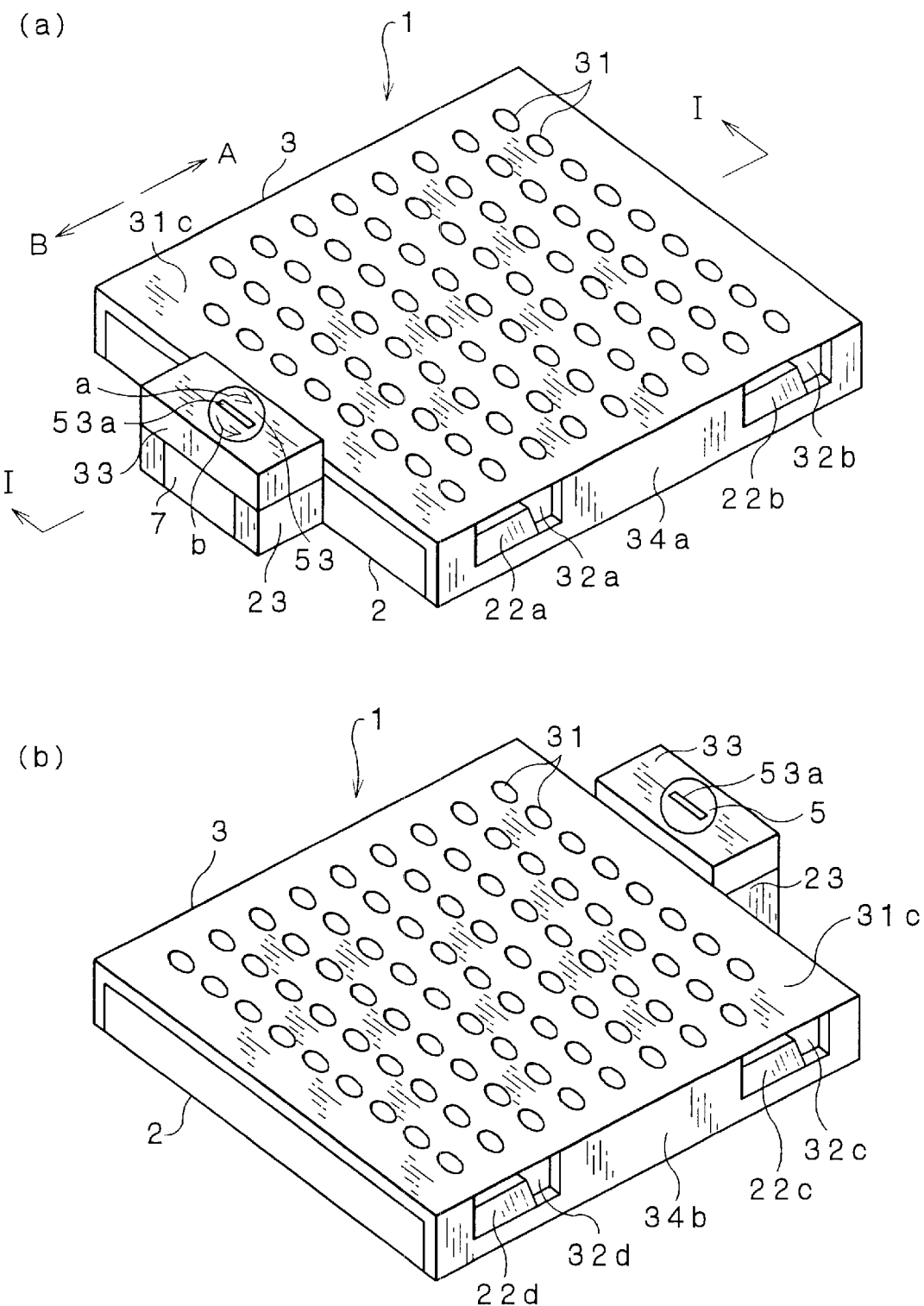
FIG. 2 shows a perspective view of the PGA socket shown in FIG. 1.
Figure 3:
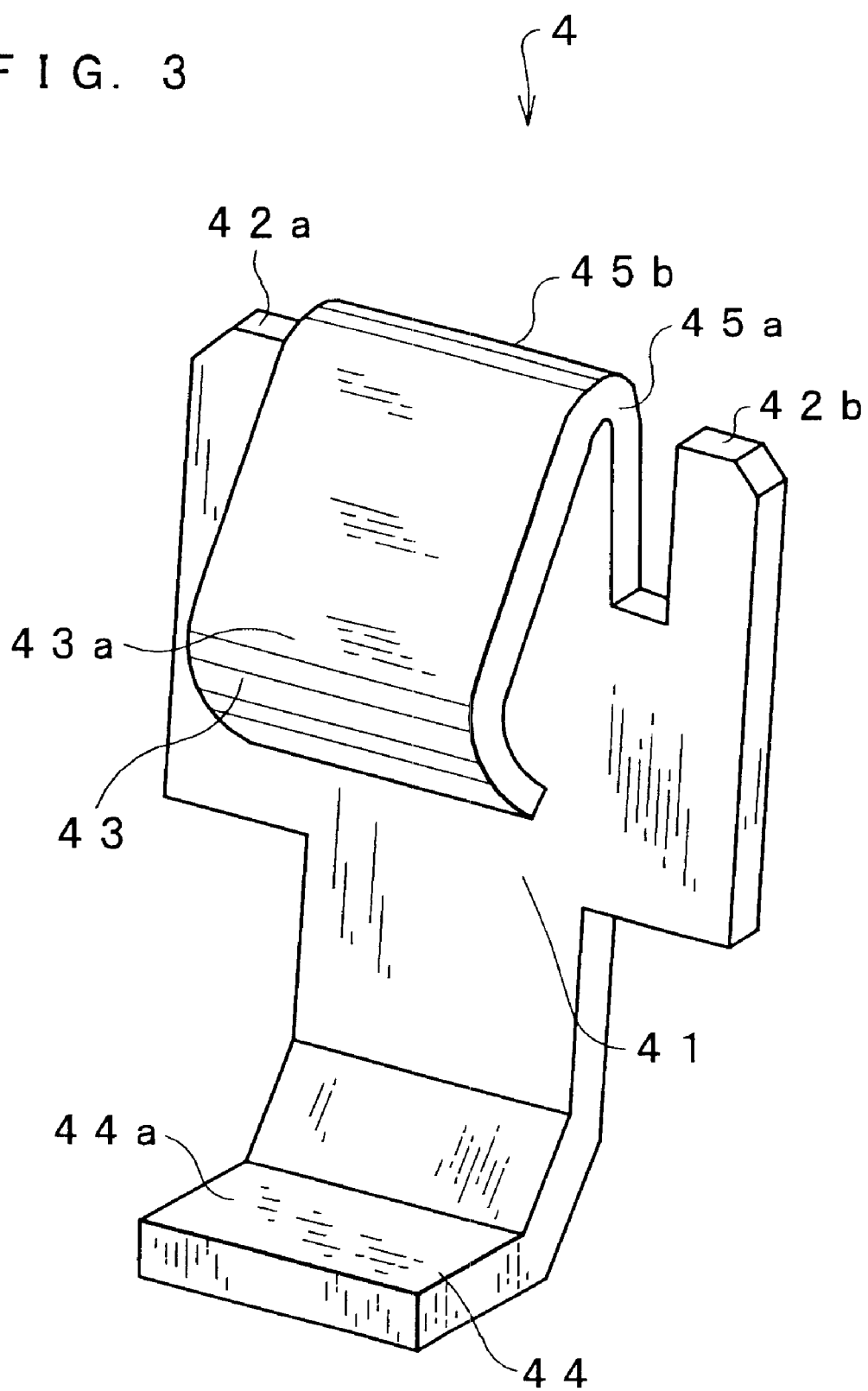
FIG. 3 shows a perspective view of a contact used in the PGA socket shown in FIG. 1.
Figure 4:
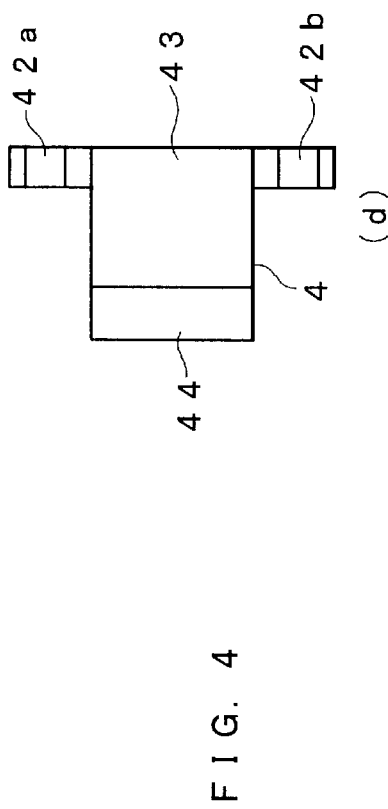
FIG. 4 is an explanatory diagram of the contact shown in FIG. 1.
Figure 4:
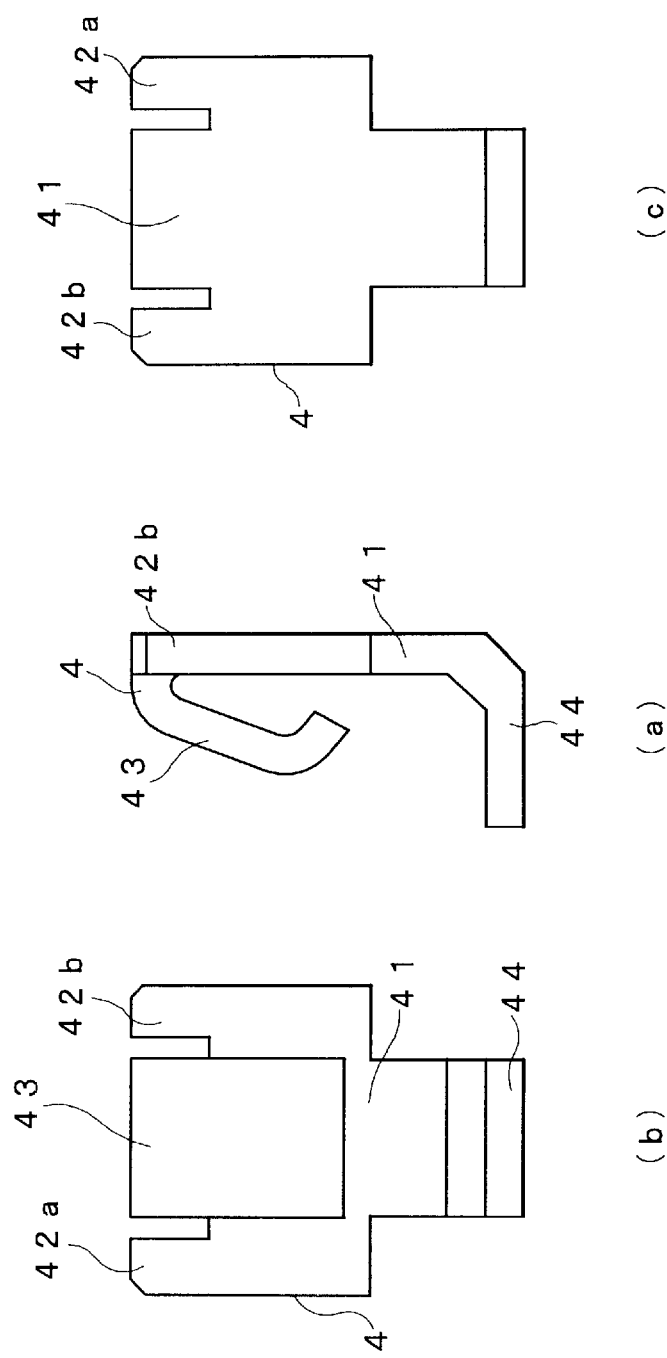
Figure 5:
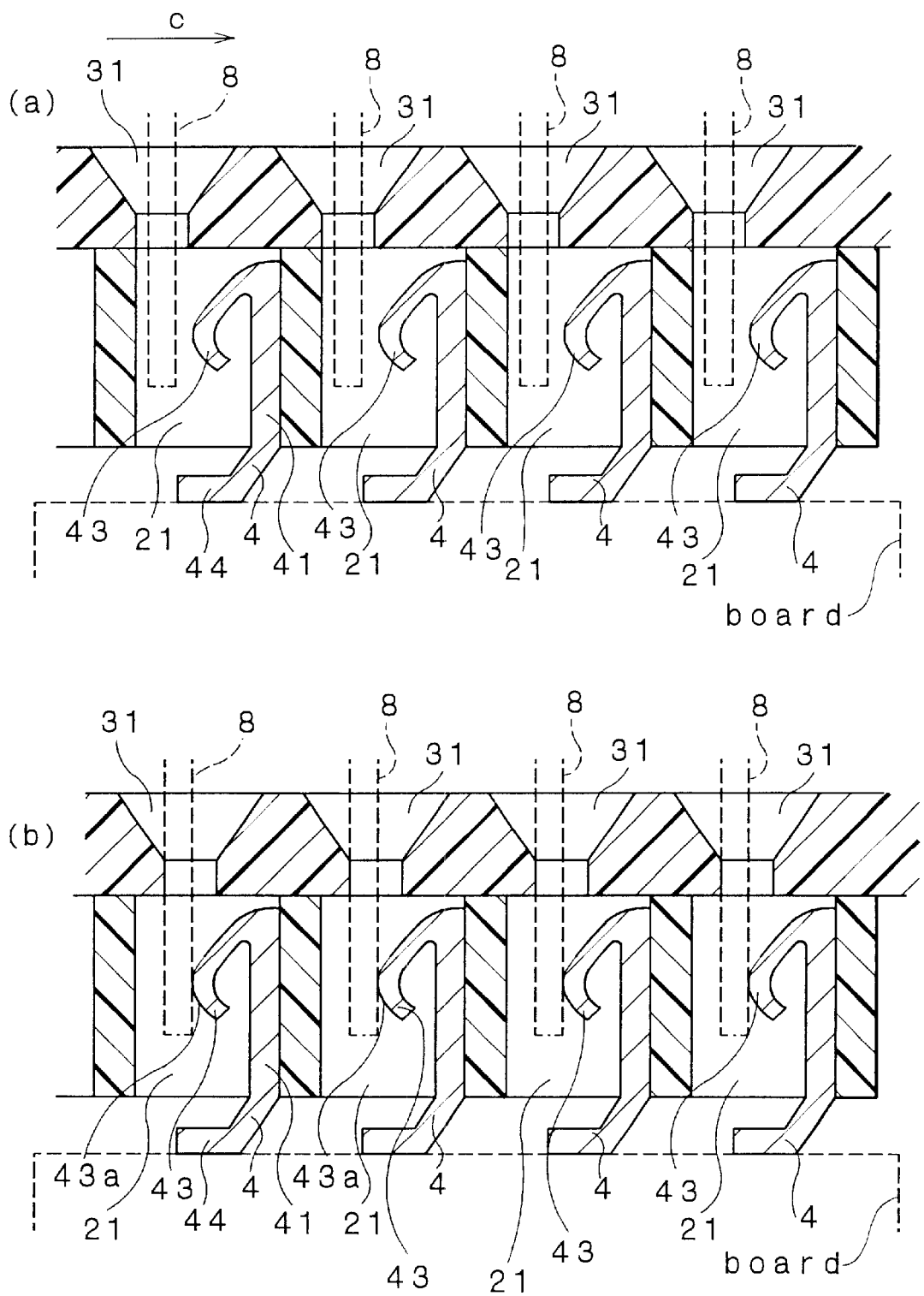
FIG. 5 shows a partially sectional view of the PGA socket shown in FIG. 2, taken at line I—I.
Figure 6:
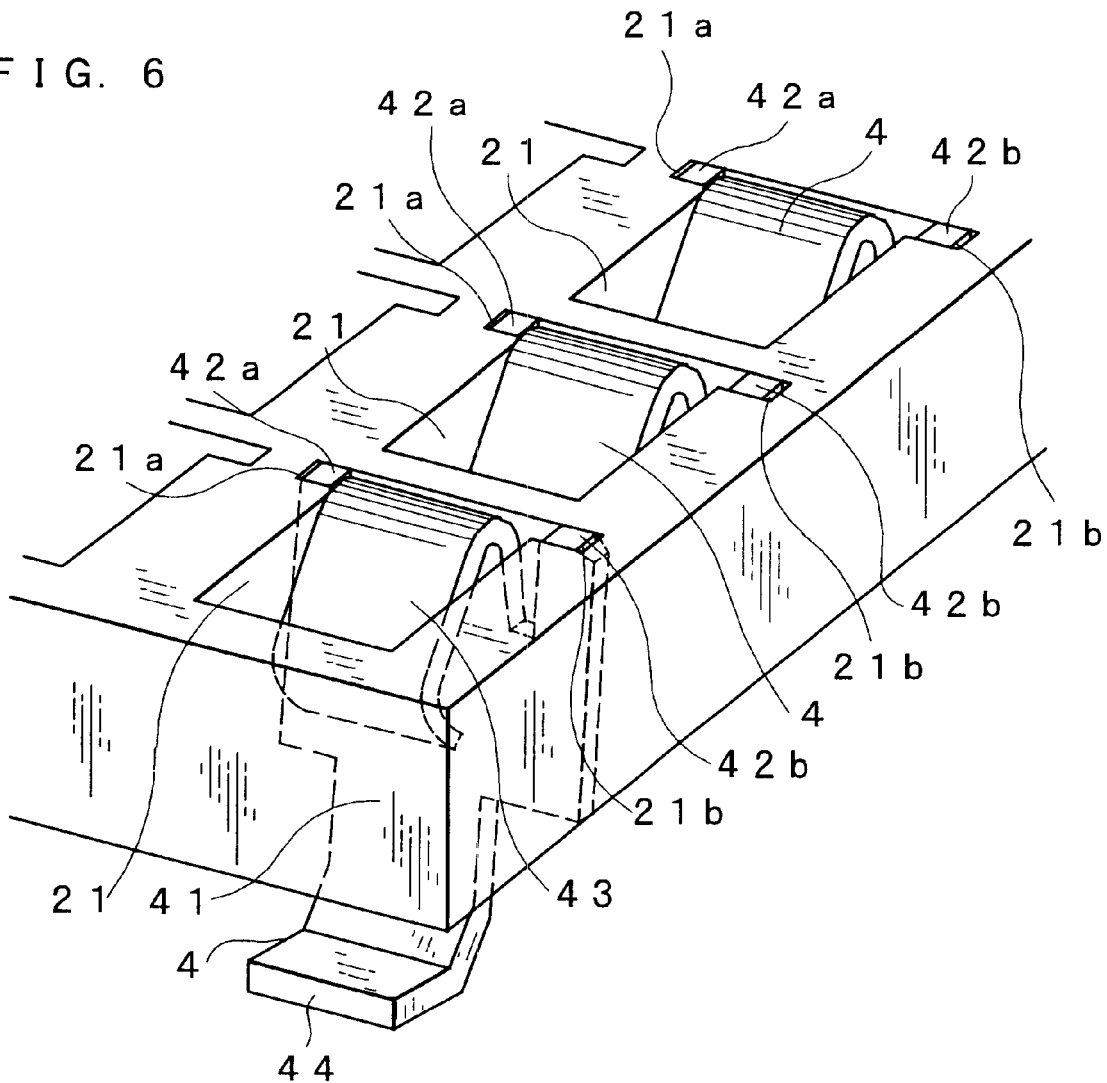
FIG. 6 is an explanatory diagram of the contacts in the PGA socket shown in FIG. 1 being held by a base housing.
Figure 7:
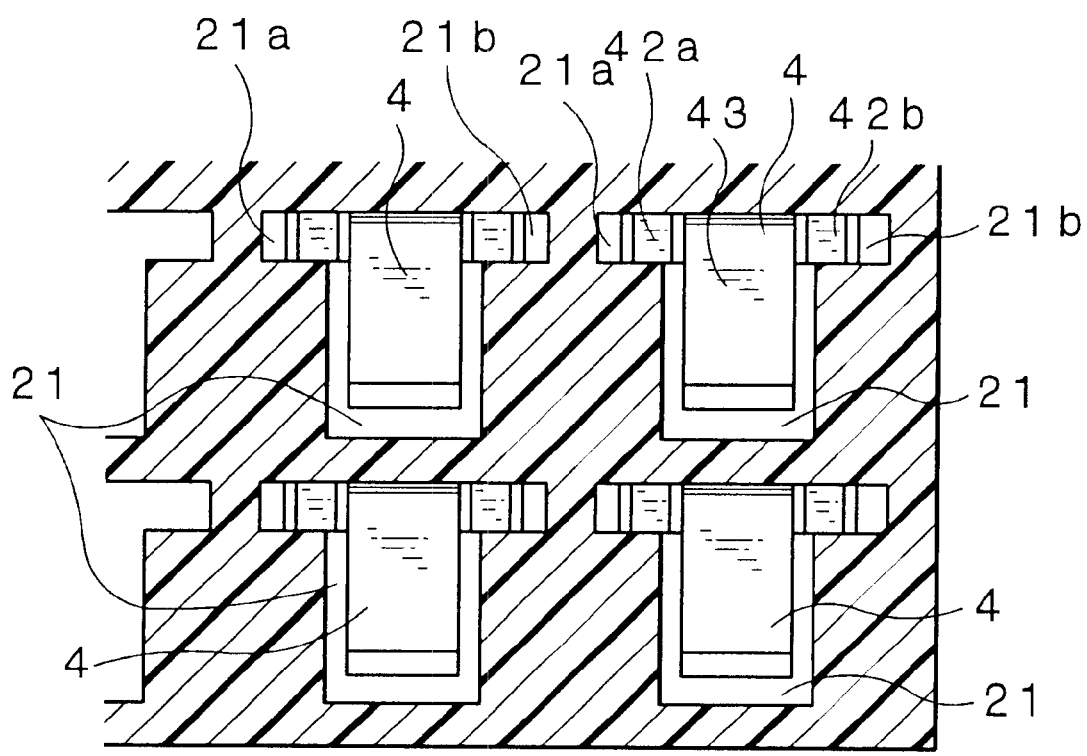
FIG. 7 is an explanatory diagram of the contacts in the PGA socket shown in FIG. 1 being held by a base housing.

A PGA socket according to a first embodiment will be described below with reference to FIGS. 1–7. FIG. 1 schematically shows an exploded perspective view of a PGA socket. FIG. 2 schematically shows a perspective view of a PGA socket. FIGS. 3 and 4 show a contact. FIG. 5 shows a partially sectional view of a PGA socket. FIGS. 6 and 7 are explanatory diagrams of contacts being held by a base housing.

A PGA socket 1 shown in FIGS. 1 and 2 comprises a base housing 2, a cover housing 3 located to overlap the base housing 2, a plurality of contacts 4, an eccentric cam 5 and cam keeping plates 6, 7. The contacts 4 are made of conductive material. The base housing 2 and the cover housing 3 are made of nonconductive material.

The base housing 2 is formed with a plurality of contact holes 21 therethrough between upper and lower surfaces thereof in a grid array fashion. However, a part 21c of the base housing 2 is not formed with the contact holes 21 for preventing erroneous insertion.

The contact hole 21 has substantially square-shaped cross section and is formed with concave portions 21a, 21b on ends of a pair of facing side surfaces (See FIGS. 6 and 7).

The base housing 2 is provided with projecting portions 22a, 22b on one side surface and with projecting portions 22c, 22d as well on another side surface facing thereto. The projecting portions 22a, 22b, 22c, and 22d are inserted into below-described opening portions 32a, 32b, 32c, and 32d of the cover housing 3 as shown in FIGS. 2(a) and (b). This prevents the base housing 2 and the cover housing 3 from easily detaching.

Further, the base housing 2 is provided with a substantially rectangular parallelepiped projecting portion 23 on a side surface where the projecting portions 22a, 22b, 22c, and 22d are not formed. The projecting portion 23 is formed with a slot-like through hole 23a therethrough between upper and lower surfaces and is provided with concave portions 23b, 23c, which are rectangular in a plan view, in which upper and lower surfaces of a region with through hole 23a formed thereon are included. The cam keeping plates 6, 7 are attached in the concave portions 23b, 23c respectively in a condition where a shaft section 51 of the eccentric cam 5 is inserted in the through hole 23a. Thereby the shaft section 51 is held in the through hole 23a.

The cover housing 3 has a plurality of substantially circular through holes 31 therethrough between upper and lower surfaces thereof in a grid array fashion into which the pins of a PGA package are inserted. However, a part 31c of the cover housing 3 is not formed with the through holes 31 for preventing erroneous insertion.

The through holes 31 are formed in positions in which pins 8 do not contact contacts 4 at insertion into the through holes 31(See FIG. 5(a)) and the pins 8 come in contact with contacts 4 when the cover housing 3 slides over the base housing 2 after insertion (See FIG. 5(b)).

The cover housing 3 is formed with a pair of extending portions 34a, 34b extending downwardly. The extending portion 34a also formed with substantially rectangular opening portions 32a, 32b. The extending portion 34b is also formed with substantially rectangular opening portions 32c, 32d in a similar way. A size of a height (length) direction of the opening portions 32a, 32b, 32c, 32d is substantially equal to a size for the projecting portions 22a, 22b, 22c, 22d to be inserted for the purpose of preventing the cover housing 3 from wobbling on the base housing 2 in a vertical direction. A size of a width direction of the opening portions 32a, 32b, 32c, 32d is wider than a size of the width direction of the projecting portions 22a, 22b, 22c, 22d so that the pins 8 of the PGA package and the contacts 4 may be in contact and out of contact by sliding movement of the cover housing 3 over the base housing 2.

Further, the cover housing 3 is provided with a substantially rectangular projecting portion 33 on a side surface where the extending portions 34a, 34b are not formed. The projecting portion 33 has a slot-like through hole 33a therethrough between upper and lower surfaces. An eccentric portion 53 of the eccentric cam 5 is inserted into the through hole 33a.

As shown in FIGS. 3 and 4, the contact 4 includes a plate-like base portion 41, a pair of projecting portions 42a, 42b provided continuously at one end of the base portion 41 to extend in a direction substantially equal to the base portion 41, a turned portion 43 provided continuously at one end of the base portion 41 to face the base portion 41, and a tail portion 44 provided continuously at the other end of the base portion 41 so that a surface 44a may be substantially perpendicular to a surface of the base portion 41.

The projecting portions 42a, 42b are respectively press-fitted in concave portions 21a, 21b in the contact hole 21 formed with the base housing 2 (See FIGS. 6 and 7). Thereby the contact 4 is held in the base housing 2. In short, the projecting portions 42a, 42b function as press-fitted portions to the base housing 2.

The turned portion 43 is bent at obtuse angle so that a contact portion 43a projecting into opposite side to the base portions 41 is provided therewith. Therefore, the contact portion 43a of the turned portion 43 is elastically deformed by coming in contact with the pin 8 of the PGA package (See FIG. 5(b)). In short, the turned portion 43 functions as a contact portion for being in contact with the pin 8.

The tail portion 44 is soldered for the PGA socket 1 to be mounted on a board. In short, the tail portion 44 functions as a soldering portion.

In the above-mentioned contact 4, usually flux does not adhere on a surface of the contact portion 43a of the turned portion 43 in contact with a pin of a PGA package (i.e. a contact surface) since flux passes from the tail portion 44 over a surface of the base portion 41 facing the turned portion 43.

To adhere on the contact surface of the contact portion 43a after passing over the surface of the base portion 41 facing the turned portion 43, flux is required to rise from the tail portion 44 to boundaries 45a, 45b dividing the base portion 41 and the turned portion 43 through the base portion 41 and then move along the turned portion 43. Usually, the more flux rises, the more energy is needed. Accordingly, flux is unlikely to reach the boundaries 45a, 45b that are on higher position for the tail portion 44. Therefore, flux is unlikely to adhere on the contact surface of the contact portion 43a of the contact 4.

The eccentric cam 5 has a sliding function for sliding the cover housing 3 over the base housing 2. The eccentric cam 5 includes a cylindrical shaft section 51, a cylindrical connecting section 52 extending from one end surface of the shaft 51 in an axial direction of the shaft section 51, and an eccentric section 53 extending from one end surface of the connection section 52 in an axial direction of the connection section 52, wherein the shaft section 51 is formed to be in axial alignment with the connection section 52 and not to be in axial alignment with the eccentric section 53. A rectangular concave portion 53a for fitting an operating tool such as flat blade screwdrivers is formed on the eccentric section 53. The shaft section 51 is inserted into the through hole 23a of the base housing 2 and the eccentric section 53 is inserted into the through hole 33a of the cover housing 3. The eccentric cam 5 is of a height substantially equal to an entire height of the projecting portion 23 of the base housing 2 and the projecting portion 33 of the cover housing 3 overlapping each other. The connection section 52 is of a height substantially equal to a depth of the concave portion 23b of the projecting portion 23 of the base housing 2.

By turning a flat blade screwdriver fitted to the concave portion 53a in direction of arrow a in FIG. 2(a), the cover housing 3 is slid over the base housing 2 in direction of arrow A in FIG. 2(a). By turning the screwdriver in direction of arrow b in FIG. 2(a), the cover housing 3 is slid over the base housing 2 in direction of arrow B in FIG. 2(a).

The cam keeping board 6 has substantially rectangular form and is of a thickness substantially equal to a depth of the concave portion 23b of the projecting portion 23 of the base housing 2 and provided with a half slot-like notch 6a in a center of one side surface thereof. In a PGA socket 1 in an assembled condition, the cam keeping board 6 is located in the concave portion 23b of the base housing 2, so that a side surface thereof facing the side surface with the notch 6a may be on a base housing 2 side.

The cam keeping board 7 includes a rectangular side plate 71, an upper plate 72 extending from a top of the side plate 71 in cross direction, and a lower plate 73 extending from a bottom of the side plate 71 in a direction equal to the upper plate 72. The upper plate 72 is provided with a half slot-like notch 72a in a center of a side surface that is not in succession with the side plate 71. The upper plate 72 is of a thickness substantially equal to a depth of the concave portion 23b of the projecting portion 23 of the base housing 2. The lower plate 73 is of a thickness substantially equal to a depth of the concave portion 23c of the projecting portion 23 of the base housing 2. The cam keeping board 7 is mounted on the projecting portion 23 of the base housing 2 so that the upper and lower plates 72 and 73 may be located in the concave portions 23b and 23c of the base housing 2 respectively.

The connection section 52 of the eccentric cam 5 is located in a slot formed with the notch 6a of the cam keeping board 6 and the notch 72a of the cam keeping board 7. A size of the slot is smaller than a size of the shaft section 51 of the eccentric cam 5 to prevent the eccentric cam 5 from detaching.

An assembled condition of PGA socket will be described below.

The shaft section 51 of the eccentric cam 5 is inserted into the trough hole 23a of the projecting portion 23 of the base housing 2. The cam keeping board 6 is located in the concave portion 23b of the projecting portion 23 of the base housing 2. And the cam keeping board 7 is mounted on the projecting portion 23 of the base housing 2 so that the upper and lower plates 72 and 73 of the cam keeping board 7 may be located in the concave portions 23b and 23c of the projecting portion 23 of the base housing 2 respectively. Further, the cover housing 3 is mounted on the base housing 2 so that the base housing 2 may be located between the extending portions 34a and 34b of the cover housing 3 and the projecting portions 22a, 22b, 22c, 22d of the base housing 2 may be inserted into the opening portions 32a, 32b, 32c, 32d of the cover housing 3.

As shown in FIGS. 6 and 7, a plurality of contacts 4 are press-fitted in the contact holes 21 of the base housing 2 respectively.

A relationship of positions of contacts 4 and pins 8 will be described below.

As shown in FIG. 5(a), when a PGA package is mounted on a PGA socket, pins 8 of a PGA package are inserted through the through holes 31 of the cover housing 3 into the contact holes 21 of the base housing 2 to a position in which the pins 8 of the PGA package face the turned portions 43 of the contacts 4 without contacting the cover housing 3 and the base housing 2.

When the eccentric cam 5 is turned by flat blade screwdriver in direction of arrow a in FIG. 2(a) in the above-mentioned condition, the cover housing 3 is slid over the base housing 2 in direction of arrow A in FIG. 2, that is, in direction of arrow C in FIG. 5(a). While the cover housing 3 is being slid, inner walls of the through holes 31 thereof come in contact with the pins 8. By being pushed by the cover housing 3, the pins 8 move in direction of arrow C in FIG. 5(a). As shown in FIG. 5(b), the pins 8 are hereby in contact with the contact portions 43a of the turned portions 43 of the contacts 4. At this time, the pins 8 elastically deform the turned portions 43 slightly in direction of the base portion 41 by pressing the contact portions 43a. Thereby the pins 8 and the contact portions 43a press each other by elastic restoring force of the turned portion 43.

In the above-mentioned contact 4 of which construction is shown in FIG. 4, flux rarely adheres on a contact surface of the contact portion 43a of the turned portion 43 when the tail portion 44 is soldered on a board. The contacts 4, where flux is unlikely to adhere on contact surfaces of the contact portions 43a, are used in the PGA socket 1. Therefore, a loose electrical connection of the pins 8 of the PGA package and the contacts 4 is prevented, resulting in increase in yield of the products. Enlarging the contact 4 in size of the height direction to prevent flux from adhering on the contact portion thereof is not necessary, meeting a requirement of thin equipments for mounting PGA sockets. Further, the contact 4 may be manufactured at low cost since the contact 4 may be formed by bending a metal plate.

Figure 8:
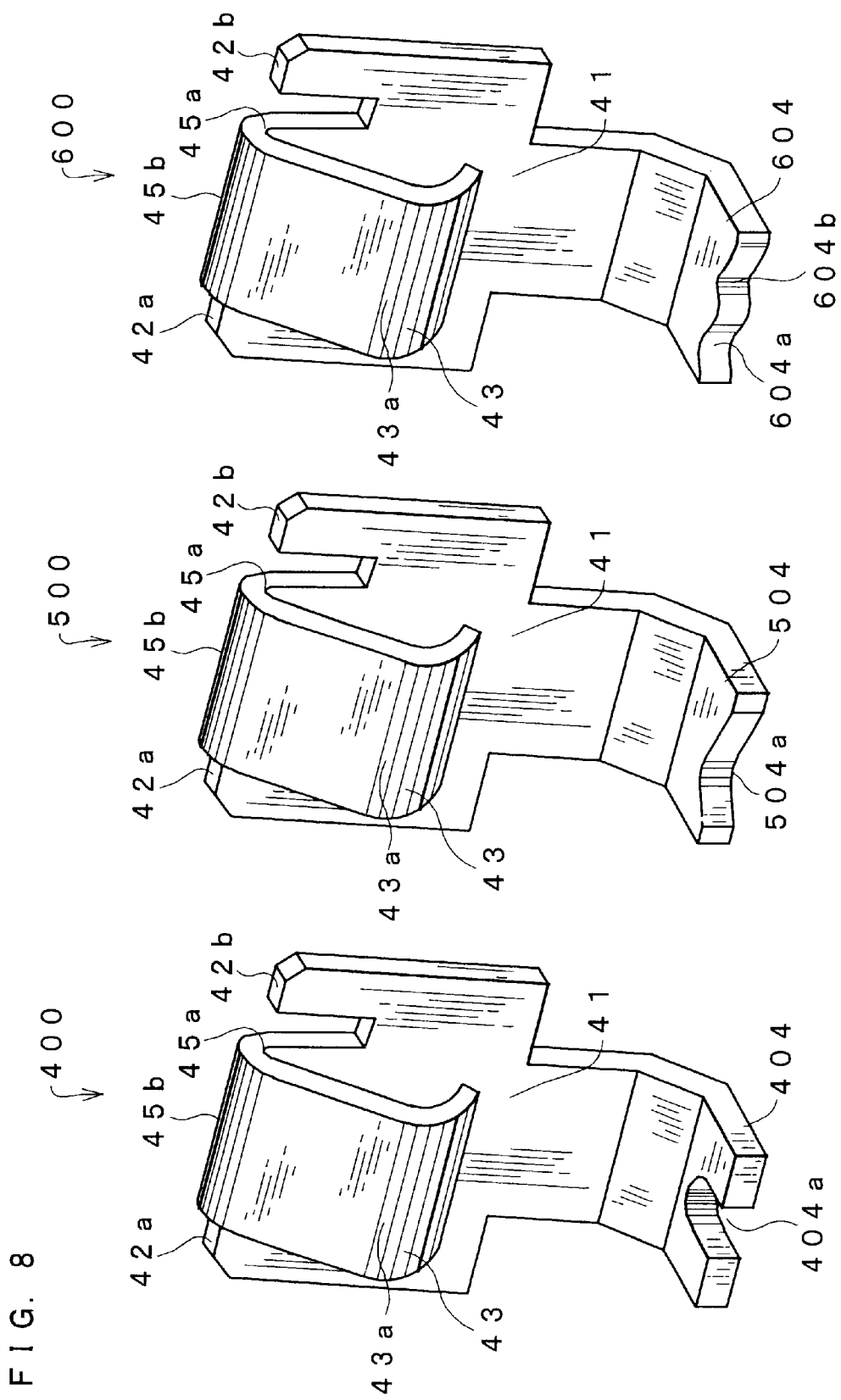
FIG. 8 shows a variant of the contact shown in FIG. 4.

Contacts 400, 500, 600 shown in FIG. 8 may be used for the PGA socket 1 instead of the above-mentioned contact 4. However, the contacts 400, 500, 600 shown in FIG. 8 include tail portions in improved shapes of the tail portion 44 of the contact 4. In the contact 400, a tail portion 404 is formed with a valley portion 404a on a tip portion thereof so that the tail portion 404 may be in U shape. In the contact 500, a tail portion 504 is formed with a valley portion 504a that is wider and shallower than the valley portion 404a of the tail portion 404 of the contact 400, on a tip portion thereof. The contact 600 is formed with two valley portions 604a, 604b so that a tip portion thereof may be in wavy shape. When a contact is formed with the above-mentioned tail portions, an area to be soldered is bigger than the tail portion 44 of the contact 4. As a result, the contact can be soldered on a board more reliably.

A Second Embodiment

A second embodiment is a variant of the PGA socket according to the first embodiment, where a contact is deformed. Since the members described in the first embodiment other than the contact may be applied to the second embodiment, only a contact of PGA socket will be described with reference to FIG. 9 in the second embodiment.

Figure 9:
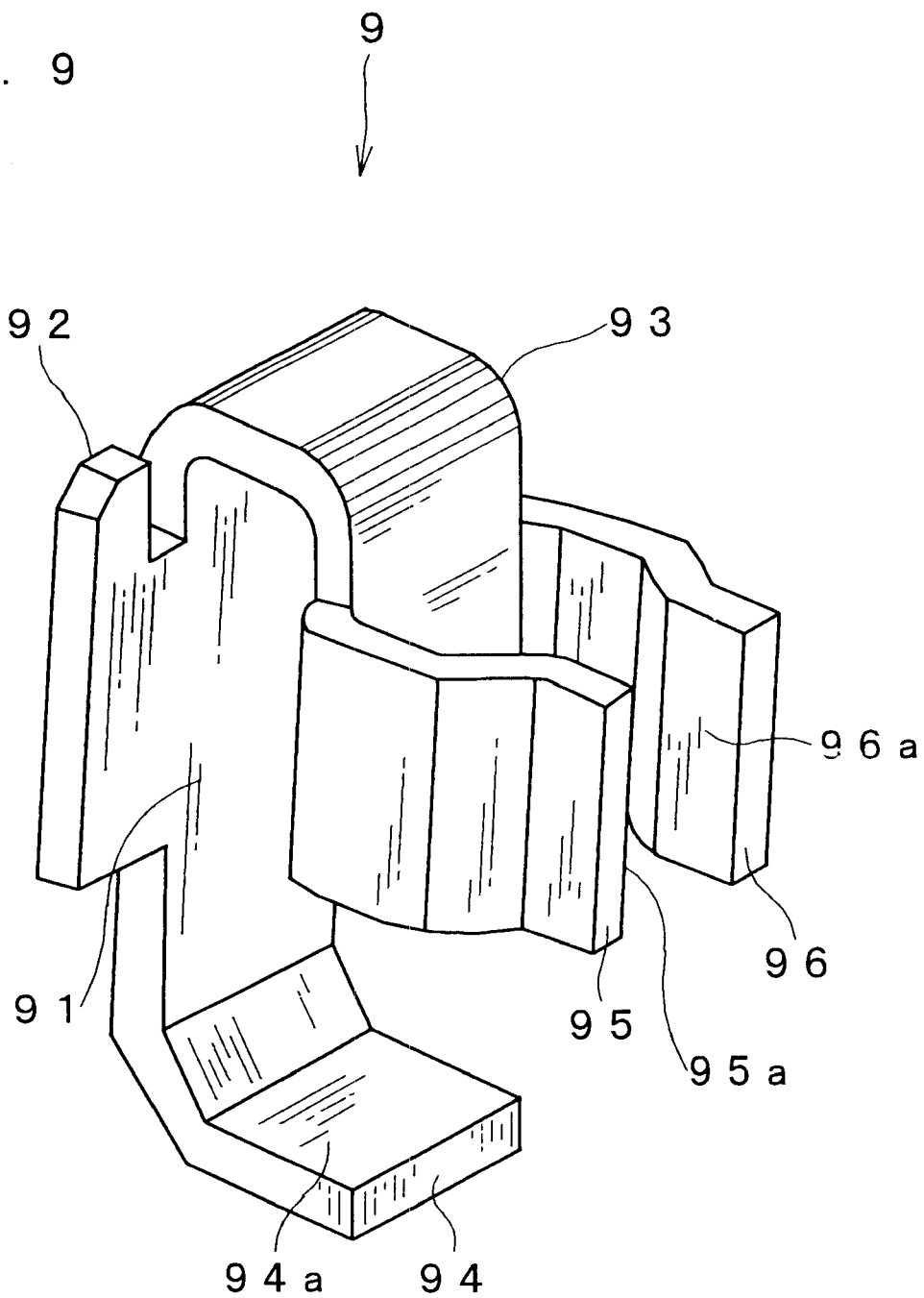
FIG. 9 shows a perspective view of a contact used in a PGA socket according to a second embodiment.

A contact 9 according to the second embodiment shown in FIG. 9 includes a plate-like base portion 91, a pair of projecting portions 92 provided continuously at one end of the base portion 91 to extend in a direction substantially equal to the base portion 91, a turned portion 93 provided continuously at one end of the base portion 91 to face the base portion 91, a pair of facing portions 95, 96 provided continuously in the turned portion 93 to face each other by extending from both side surfaces of the turned portion 93 in the vicinity of a tip portion thereof in a direction substantially perpendicular to a surface of the base portion 91, and a tail portion 94 provided continuously at the other end of the base portion 91 so that a surface 94a may be substantially perpendicular to a surface of the base portion 91.

Tip portions of the facing portions 95, 96 are bent so that the tip portions of the facing portions 95, 96 face in parallel with each other and so that a distance between the tip portions may be shorter than a distance between the facing portions 95, 96 in the vicinity of the turned portion 93 and slightly shorter than a diameter of a pin of a PGA package. By bending the tip portions of the facing portions 95, 96 in this way, contact portions 95*a*, 96*a* are formed, where the contact 9 is in contact with a pin of a PGA package. The contact portions 95*a*, 96*a* are elastically deformed by contacting the pin of the PGA package. In short, the contact portions 95*a*, 96*a* of the facing portions 95, 96 function as contact portions contacting the pin of the PGA package.

The contact according to the second embodiment, similar to the contact 4 described in the first embodiment, has a construction where flux is unlikely to adhere on facing surfaces of the contact portions 95*a*, 96*a* for contacting a pin of a PGA package. Further, since the contact has a construction where the contact 9 and the pin of the PGA package are in contact on two facing surfaces of the contact portions 95*a*, 96*a*, the contact 9 and the pin are electrically connected more reliably.

Although the preferred embodiments of the present invention have been described, the present invention is not limited thereto. Various changes and modifications to the preferred embodiments are possible within the scope of the invention claimed. For example, the contacts 4, 9, not being limited to those shown in FIGS. 3 and 9, may include the turned portions 43, 93 having parts to face the base portions 41, 91 and formed continuously at ends of the base portions 41, 91. A sliding mechanism, not being limited to the eccentric cam 5, may be capable of sliding the cover housing 3 over the base housing 2.

What is claimed is:

1. A contact for a PGA formed by bending a metal plate comprising:
   a plate-like base portion,
   a projecting portion provided continuously in the base portion to extend in a direction substantially equal to the base portion,
   a turned portion provided continuously at one end of the base portion to face the base portion,
   a tail portion provided continuously at the other end of the base portion not to face the base portion, and
   a pair of facing portions provided continuously in the turned portion to extend in a direction substantially perpendicular to a direction connecting between the one end of the base portion and the other end of the base portion and to face each other.

2. A PGA socket comprising:
   a plurality of contacts for a PGA, each contact of the plurality contacts according to claim 1;
   a base housing having a plurality of contact holes, wherein the plurality of contacts for the PGA are connected to the housing by press-fitting the projecting portions of each of the plurality of contacts for the PGA into the plurality of contact holes;
   a cover housing disposed on top of the base housing, the cover housing having a plurality of holes adapted to accept a pin of a PGA package for electrical connection with the plurality of contacts for the PGA; and
   a sliding mechanism for sliding the cover housing over the base housing.

3. A contact for a PGA formed by bending a metal plate comprising:
   a plate-like base portion,
   a projecting portion provided continuously in the base portion to extend in a direction substantially equal to the base portion,
   a turned portion provided continuously at one end of the base portion to face the base portion, and
   a tail portion provided continuously at the other end of the base portion not to face the base portion, wherein a tip of said turned portion is spaced apart from said base portion,
   wherein said contact is symmetrical with respect to a centerline in a direction extending from said one end to said other end of said base portion.

4. A PGA socket comprising:
   a plurality of contacts for a PGA, each contact of the plurality of contacts according to claim 5;
   a base housing having a plurality of contact holes, wherein the contact for the PGA is connected to the housing by press-fitting the projecting portion of the contact for the PGA into the plurality of contact holes;
   a cover housing disposed on top of the base housing, the cover housing having a plurality of holes adapted to accept a pin of a PGA package for electrical connection with the plurality of contacts for the PGA; and
   a sliding mechanism for sliding the cover housing.

* * * * *